United States Patent [19]
Yakura et al.

[11] Patent Number: 5,233,563
[45] Date of Patent: Aug. 3, 1993

[54] MEMORY SECURITY DEVICE

[75] Inventors: James P. Yakura, Colorado Springs; Richard K. Cole, Woodland Park, both of Colo.

[73] Assignee: NCR Corporation, Dayton, Ohio

[21] Appl. No.: 820,170

[22] Filed: Jan. 13, 1992

[51] Int. Cl.[5] .............................................. G11C 5/14
[52] U.S. Cl. .................................... 365/226; 365/153; 365/218
[58] Field of Search .................... 365/226, 218, 153

[56] References Cited
U.S. PATENT DOCUMENTS 4,811,288  3/1989  Kleijne et al. ......................... 365/52
4,933,898  6/1990  Gilberg et al. ......................... 365/53
5,053,992  10/1991  Gilberg et al. ......................... 365/53

Primary Examiner—Eugene R. LaRoche
Assistant Examiner—Andrew Tran
Attorney, Agent, or Firm—Paul W. Martin

[57] ABSTRACT

A memory security device within a chip which employs a power source coupled to the memory. The power source produces a signal having a level sufficient to erase or destroy the memory when the chip is exposed to acid. The power source includes an electrolytic cell for producing a direct voltage output, and an electrolytic signal amplification circuit coupled between the electrolytic cell and the memory.

46 Claims, 2 Drawing Sheets

MEMORY SECURITY DEVICE

BACKGROUND OF THE INVENTION

The present invention relates to security devices for memory devices and more specifically to a memory security device and method.

Maintaining control over data within memory devices such as EEPROM's is a problem today. One approach has been to shield chips containing the memory devices from inspection and at the same time erase the memory and prevent operation of the devices upon intrusion.

Commonly assigned U.S. Pat. No. 4,811,288, entitled "Data Security Device for Protecting Stored Data", issued Mar. 7, 1989, to Kleijne et al. discloses a security device for protecting sensitive data stored in a resettable memory, including a housing formed of ceramic plates. A pair of thin film conductive paths are arranged in a meandering configuration on the inner surface of the housing. Interrupting or short circuiting the thin film conductive paths causes reset means to reset the resettable memory thereby erasing the data stored therein.

U.S. Pat. No. 4,933,898 entitled "Secure Integrated Circuit Chip with Conductive Shield", issued Jun. 12, 1990, to Gilberg et al., discloses an integrated circuit chip containing a secure area in which secure data is processed and stored. The chip includes a semiconductor layer containing circuit elements, a first conductive layer coupled to the semiconductor layer to interconnect the circuit elements, and a second conductive layer overlying the circuit elements to define a secure area and coupled to the circuit elements for conducting a predetermined signal which is essential to the intended function of the shielded circuit elements. Removal of the second conductive layer prevents the predetermined signal from being provided to the circuit elements.

While these security devices work well, they may still be defeated by selective etching techniques to defeat the conductive layers. Therefore, it would be desirable to produce a memory security device which cannot be defeated by etching.

SUMMARY OF THE INVENTION

In accordance with the teachings of the present invention, a memory security device and method is provided. The memory security device includes a power source coupled to the memory, which produces a signal having a level sufficient to erase or destroy the memory when the chip is exposed to acid. The power source includes an electrolytic cell located within the chip which produces a direct voltage signal, and an electrolytic signal amplification circuit coupled between the electrolytic cell and the memory. The electrolytic cell includes an anode and a cathode. The electrolytic signal amplification circuit includes an oscillator for producing an alternating voltage output, and a multiplier-rectifier circuit coupled between the oscillator and the memory.

It is accordingly an object of the present invention to provide a memory security device.

It is another object of the present invention to provide a memory security device which produces an output signal having a level sufficient to erase or destroy the memory when the chip containing the memory is exposed to acid.

It is another object of the present invention to provide a chip containing a memory security device.

BRIEF DESCRIPTION OF THE DRAWINGS

Additional benefits and advantages of the present invention will become apparent to those skilled in the art to which this invention relates from the subsequent description o the preferred embodiments and the appended claims, taken in conjunction with the accompanying drawings, in which:

DETAILED DESCRIPTION OF THE PREFERRED EMBODIMENT

Figure 1:
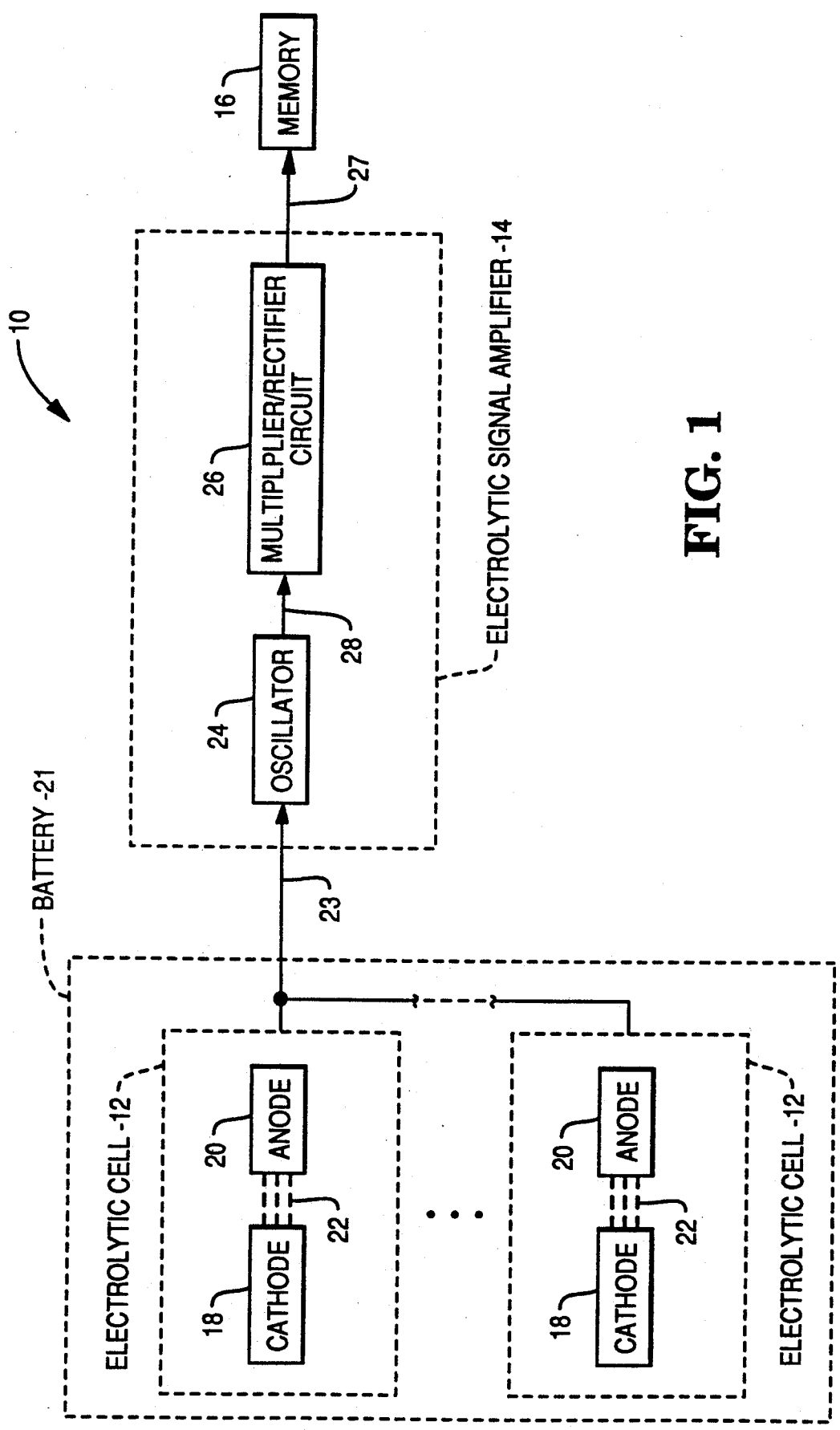
FIG. 1 is a block diagram of the memory security device of the present invention.

Referring now to FIG. 1, memory security device 10 includes electrolytic cell 12 and electrolytic signal amplifier 14 coupled between electrolytic cell 12 and memory 16.

Electrolytic cell 12 includes cathode 18 and anode 20, which are preferably built into a chip containing memory 16. Electrolytic cell 12 also includes acid 22 which is applied by a potential data thief during a deprocessing etch of the chip. Thus, electrolytic cell 12 does not produce a direct voltage output 23 until an etching of the chip is attempted.

The anode and cathode materials may be chosen to produce an expected voltage level in the presence of an anticipated acid etch. It is envisioned that individual electrolytic cells could be connected in parallel to form a battery 21 employing a plurality of electrolytic cells connected in parallel, under the constraints of cell spacing and acid resistivity.

Electrolytic signal amplification circuit 14 amplifies direct voltage output 23 from electrolytic cell 12 to produce an output 27 having a predetermined level, which may be strong enough to erase or even destroy memory 16. Destruction prevents memory 16 from being used again and includes generating an overheating current to burn out memory 16. Preferably, electrolytic signal amplification circuit 14 includes oscillator 24 and multiplier-rectifier circuit 26, both of which may be limited to data security or may be shared with other roles within the chip. For example, electrolytic signal amplification circuit 14 may be used to provide programming voltage during normal operation.

Oscillator 24 produces an alternating signal output 28 in response to direct voltage output 23 from electrolytic cell 12.

Multiplier-rectifier circuit 26 amplifies alternating signal output 28 from oscillator 24 and rectifies it to produce direct voltage output 27. Preferably, multiplier-rectifier circuit 26 rectifies in such a way that capacitors charge in parallel and discharge in series, such as the one disclosed in "Electronic Fundamentals and Applications", by John D. Ryder, fifth edition, page 472.

Memory 16 is preferably an EEPROM, although other types of memory devices may also be protected by the present invention.

Figure 2:
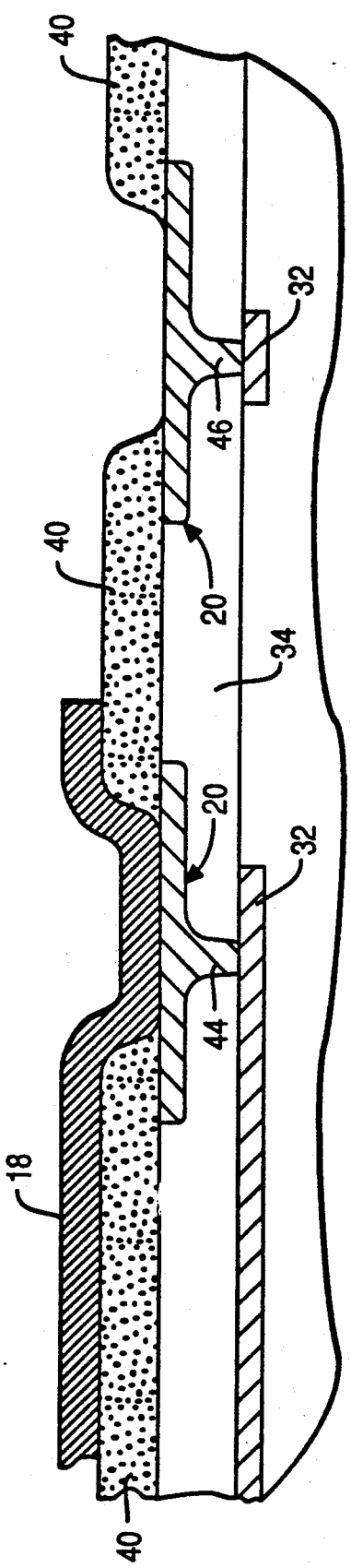
FIG. 2 is a cross sectional view of a chip containing a first embodiment of the memory security device of the present invention.
Figure 3:
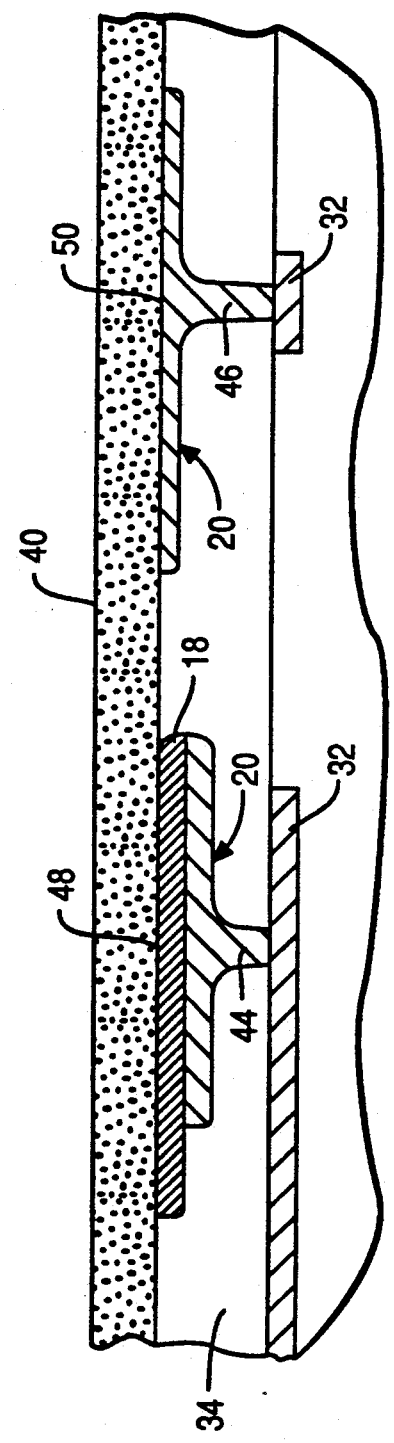
FIG. 3 is a cross sectional view of a chip containing a second embodiment of the memory security device of the present invention.

Turning now to FIGS. 2 and 3, two chips employing memory security device 10 are shown. Each chip includes anode 20, cathode 18, underlying layer of conductive material 32, dielectric layer 34, and passivation layer 40.

Anode 20 preferably includes anode terminals 44 and 46. In a first embodiment (FIG. 2), acid reaches cathode 18 and simultaneously reaches anode terminal 46. In a second embodiment (FIG. 3), acid simultaneously reaches cathode 18 and anode terminal 46. In both embodiments, anode 44 acts as a conductive path and is part of normal chip manufacture.

Anode terminals 44 and 46 are preferably made of Aluminum and are formed by cutting pathways through dielectric layer 34 and then depositing and patterning anode material.

Conductive layer 32 is formed by known methods, preferably of Aluminum. Layer 32 may also be heavily doped silicon or poly silicon Electrolytic signal amplification circuit 14 is coupled to conductive layer 32.

Dielectric layer 34 primarily serves as an insulator and is formed by known methods.

Passivation layer 40 serves to protect the chip from mechanical damage. Passivation layer 40 is patterned to open pathways to pads by methods known in the art.

Cathode 18 is preferably made of copper. In the second embodiment (FIG. 3), cathode metal is deposited and patterned so that it caps and encloses selected regions of anode terminal 44. Passivation layer 40 is then deposited and patterned. In the first embodiment (FIG. 2), cathode metal is deposited over the patterned passivation layer 40. Selected areas of cathode 18 are then patterned.

Although the invention has been described with particular reference to certain preferred embodiments thereof, variations and modifications of the present invention can be effected within the spirit and scope of the following claims. For example, the present invention may be used to destroy other chip components or an entire chip.

What is claimed is:

1. A security device for a memory within a chip comprising a power source coupled to the memory which produces a signal having a level sufficient to erase the contents of the memory when the chip is exposed to acid.

2. The security device as recited in claim 1, wherein the level is also sufficient to destroy the memory when the chip is exposed to acid.

3. The security device as recited in claim 1, wherein the power source comprises an electrolytic cell within the chip.

4. The security device as recited in claim 3, wherein the electrolytic cell comprises:
a cathode, and
an anode electrically coupled to the cathode through the acid.

5. The security device as recited in claim 4, wherein the chip comprises:
a passivation layer;
a dielectric layer below the passivation layer; and
a conductive layer below the dielectric layer.

6. The security device as recited in claim 5, wherein the anode comprises:
a first anode terminal extending through the dielectric layer; and
a second anode terminal extending through the dielectric layer at a predetermined distance from the first anode terminal.

7. The security device as recited in claim 6, wherein the cathode is located within the dielectric layer between the passivation layer and the first anode terminal.

8. The security device as recited in claim 6, wherein the cathode is located within the passivation layer on top of the first anode terminal.

9. The security device as recited in claim 3, wherein the power source further comprises an electrolytic signal amplification circuit coupled between the electrolytic cell and the memory.

10. The security device as recited in claim 9, wherein the electrolytic signal amplification circuit comprises:
an oscillator for producing an alternating voltage output, and
means coupled to the oscillator for amplifying and rectifying the alternating voltage output.

11. The memory security device as recited in claim 1, wherein the power source comprises a battery, including a plurality of electrolytic cells connected in parallel.

12. The security device as recited in claim 1, wherein the memory comprises an EEPROM.

13. A memory security device within a chip comprising:
a power source coupled to the memory which produces a signal having a level sufficient to erase the contents of the memory when the chip is exposed to acid, the power source including an electrolytic cell located within the chip which produces a direct voltage signal, including a cathode and an anode, the power source further including an electrolytic signal amplification circuit coupled between the electrolytic cell and the memory, including an oscillator having an alternating voltage output and a multiplier-rectifier circuit coupled to the alternating voltage output.

14. An integrated circuit chip comprising:
a memory within the chip; and
a device coupled to the memory which produces a signal having a level sufficient to erase the contents of the memory when the chip is exposed to acid.

15. The integrated circuit chip as recited in claim 14, wherein the level is also sufficient to destroy the memory when the chip is exposed to acid.

16. The integrated circuit chip as recited in claim 14, wherein the memory comprises an EEPROM.

17. The integrated circuit chip as recited in claim 14, further comprising a power source including an electrolytic cell within the chip.

18. The integrated circuit chip as recited in claim 17, wherein the chip further comprises:
a passivation layer;
a dielectric layer below the passivation layer; and
a conductive layer below the dielectric layer.

19. The integrated circuit chip as recited in claim 18, wherein the anode comprises:
a first anode terminal extending through the dielectric layer; and
a second anode terminal extending through the dielectric layer at a predetermined distance from the first anode terminal.

20. The integrated circuit chip as recited in claim 19, wherein the cathode is located within the dielectric layer between the passivation layer and the first anode terminal.

21. The integrated circuit chip as recited in claim 19, wherein the cathode is located within the passivation layer on top of the first anode terminal.

22. The integrated circuit chip as recited in claim 17, wherein the power source further comprises an electrolytic signal amplification circuit coupled between the electrolytic cell and the memory.

23. The integrated circuit chip as recited in claim 22, wherein the electrolytic signal amplification circuit comprises:
an oscillator for producing an alternating voltage output, and
means coupled to the oscillator for amplifying and rectifying the alternating voltage output.

24. The integrated circuit chip as recited in claim 14, further comprising a power source including a battery, including a plurality of electrolytic cells connected in parallel within the chip.

25. A method for protecting the contents of a memory within an integrated circuit chip comprising the step of:
(a) providing a power source coupled to the memory for producing a signal having a level sufficient to erase the contents of the memory when the chip is exposed to acid.

26. The method as recited in claim 25, wherein the level is also sufficient to destroy the memory when the chip is exposed to acid.

27. The method as recited in claim 25, wherein the memory is an EEPROM.

28. The method as recited in claim 25, wherein the chip comprises:
a passivation layer;
a dielectric layer below the passivation layer; and
a conductive layer below the dielectric layer.

29. The method as recited in claim 28, wherein step (a) comprises the substeps of:
(a-1) providing an electrolytic cell within the chip; and
(a-2) providing an electrolytic signal amplification circuit coupled between the electrolytic cell and the memory.

30. The method as recited in claim 29, wherein substep (a-1) comprises the substeps of:
(a-1-A) providing a first anode terminal extending through the dielectric layer;
(a-1-B) providing a second anode terminal extending through the dielectric layer at a predetermined distance from the first anode terminal; and
(a-1-C) capping the first anode terminal with a cathode terminal.

31. The method as recited in claim 30, wherein substep a-1 further comprises the substep of:
(a-1-D) providing a cathode within the dielectric layer between the passivation layer and the first anode terminal.

32. The method as recited in claim 30, wherein substep a-1 further comprises the substep of:
(a-1-D) providing a cathode within the passivation layer on top of the first anode terminal.

33. The method as recited in claim 29, wherein the battery signal amplification circuit comprises:
an oscillator for producing an alternating voltage output; and
means for amplifying and rectifying the alternating voltage output.

34. The method as recited in claim 25, further comprising the steps of:
(b) exposing the chip to acid; and
(c) generating the signal in response to the acid.

35. The method as recited in claim 28, wherein step (a) comprises the substeps of:
(a-1) providing a battery within the chip; and
(a-2) providing an electrolytic signal amplification circuit coupled between the battery and the memory.

36. The method as recited in claim 35, wherein step (a-1) comprises the substep of:
(a-1-A) providing a plurality of electrolytic cells connected in parallel within the chip.

37. A security device for an integrated circuit chip comprising a power source in the chip which produces a signal having a level sufficient to destroy the chip when the chip is exposed to acid.

38. The security device as recited in claim 37, wherein the power source comprises an electrolytic cell within the chip.

39. The security device as recited in claim 37, wherein the power source comprises a battery, including a plurality of electrolytic cells connected parallel.

40. An acid sensing device within a chip comprising:
an anode within the chip; and
a cathode within the chip;
the acid sensing device producing a signal when the anode and the cathode are electrically coupled to each other through the acid.

41. The acid sensing device as recited in claim 40 further comprising a signal amplification circuit.

42. The acid sensing device as recited in claim 41, wherein the signal amplification circuit comprises:
an oscillator for producing an alternating voltage output; and
means coupled to the oscillator for amplifying and rectifying the alternating voltage output.

43. The acid sensing device as recited in claim 40, within the chip comprises:
a passivation layer;
a dielectric layer below the passivation layer; and
a conductive layer below the dielectric layer.

44. The acid sensing device as recited in claim 43, wherein the anode comprises:
a first anode terminal extending through the dielectric layer; and
a second anode terminal extending through the dielectric layer at a predetermined distance form the first anode terminal.

45. The acid sensing device as recited in claim 44, wherein the cathode is located within the dielectric layer between the passivation layer and the first anode terminal.

46. The acid sensing device as recited in claim 44, wherein the cathode is located within the passivation layer on top of the first anode terminal.

* * * * *

UNITED STATES PATENT AND TRADEMARK OFFICE
CERTIFICATE OF CORRECTION

PATENT NO. : 5,233,563
DATED : August 3, 1993
INVENTOR(S) : James P. Yakura et al.

It is certified that error appears in the above-identified patent and that said Letters Patent is hereby corrected as shown below:

Column 6, line 28, after "connected" insert --in--.

Column 6, line 53, delete "form" and substitute --from--.

Signed and Sealed this

Seventh Day of June, 1994

Attest:

BRUCE LEHMAN

Attesting Officer

Commissioner of Patents and Trademarks